(12) United States Patent
Scherl et al.

(10) Patent No.: US 12,183,667 B2
(45) Date of Patent: Dec. 31, 2024

(54) SEMICONDUCTOR PACKAGE WITH POWER ELECTRONICS CARRIER HAVING TRENCH SPACING ADAPTED FOR DELAMINATION

(71) Applicant: Infineon Technologies AG, Neubiberg (DE)

(72) Inventors: Peter Scherl, Regensburg (DE); Adrian Lis, Regensburg (DE); Christian Neugirg, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 520 days.

(21) Appl. No.: 17/579,727

(22) Filed: Jan. 20, 2022

(65) Prior Publication Data
US 2023/0245968 A1 Aug. 3, 2023

(51) Int. Cl.
*H01L 23/498* (2006.01)
*H01L 21/48* (2006.01)
*H01L 21/56* (2006.01)
*H01L 23/31* (2006.01)

(52) U.S. Cl.
CPC .... *H01L 23/49844* (2013.01); *H01L 21/4857* (2013.01); *H01L 21/565* (2013.01); *H01L 23/3107* (2013.01); *H01L 23/49822* (2013.01); *H01L 23/49833* (2013.01)

(58) Field of Classification Search
CPC ........... H01L 23/49844; H01L 21/4857; H01L 21/565; H01L 23/3107; H01L 23/49822; H01L 23/49833; H01L 23/3735
See application file for complete search history.

(56) References Cited

U.S. PATENT DOCUMENTS

| | | | |
|---|---|---|---|
| 2020/0035580 A1* | 1/2020 | Hoegerl | ............ H01L 23/49524 |
| 2021/0134697 A1 | 5/2021 | Hoegerl et al. | |

* cited by examiner

*Primary Examiner* — Karen Kusumakar
*Assistant Examiner* — Shawn Shaw Muslim
(74) *Attorney, Agent, or Firm* — Murphy, Bilak & Homiller, PLLC

(57) ABSTRACT

A semiconductor package includes a first power electronics carrier including a structured metallization layer disposed on an electrically insulating substrate, a power semiconductor die mounted on the first power electronics carrier, and a first pair of metal pads that are immediately laterally adjacent one another and are low-voltage difference nodes of the semiconductor package, a second pair of metal pads that are immediately laterally adjacent one another and are high-voltage difference nodes of the semiconductor package, and an encapsulant body of electrically insulating material that encapsulates the power semiconductor die and the first and second pairs of metal pads, wherein the first pair of the metal pads are laterally isolated from one another by a first minimum separation distance, and wherein the second pair of the metal pads are laterally isolated from one another by a second minimum separation distance that is greater than the first minimum separation distance.

20 Claims, 4 Drawing Sheets

SEMICONDUCTOR PACKAGE WITH POWER ELECTRONICS CARRIER HAVING TRENCH SPACING ADAPTED FOR DELAMINATION

BACKGROUND

Many different applications such as automotive and industrial applications utilize power modules. Power modules may include multiple power devices in a single package, with these power devices being arranged as a power conversion circuit such as a single and multi-phase half-wave rectifier, single and multi-phase full-wave rectifier, voltage regulator, inverter, etc. Modern power modules are designed for highly efficient operation that can improve the electric power dissipation of an electrical system. Moreover, power modules are part of power efficient solutions to reduce or prevent anthropogenic emissions of greenhouse gases. For instance, hybrid electric vehicles (HEVs) or electric vehicles (EVs) utilize power modules to perform power conversion, inversion, switching, etc., in a power efficient manner.

There is a desire to manufacture power modules at high volumes using inexpensive techniques, such as molding techniques. One issue associated with molding techniques is the problem of delamination wherein mold compound separates from a metallized region of the package. This can create voids in the package, which in turn cause the part to fail inspection, thus negatively impacting yield and increasing the cost of production of the power module.

SUMMARY

A semiconductor package is disclosed. According to an embodiment, the semiconductor package comprises a first power electronics carrier comprising a structured metallization layer disposed on an electrically insulating substrate, a power semiconductor die mounted on the first power electronics carrier, and a first pair of metal pads that are immediately laterally adjacent one another and are low-voltage difference nodes of the semiconductor package, a second pair of metal pads that are immediately laterally adjacent one another and are high-voltage difference nodes of the semiconductor package, and an encapsulant body of electrically insulating material that encapsulates the power semiconductor die and the first and second pairs of metal pads, wherein the first pair of the metal pads are laterally isolated from one another by a first minimum separation distance, and wherein the second pair of the metal pads are laterally isolated from one another by a second minimum separation distance that is greater than the first minimum separation distance.

According to an embodiment, the semiconductor package comprises a first power electronics carrier comprising a structured metallization layer disposed on an electrically insulating substrate, a second power electronics carrier comprising a structured metallization layer disposed on an electrically insulating substrate, a first pair of metal pads from the structured metallization layer of the first power electronics carrier that are immediately laterally adjacent one another and are low-voltage difference nodes of the semiconductor package, a second pair of metal pads from the structured metallization layer of the second power electronics carrier that are immediately laterally adjacent one another and are high-voltage difference nodes of the semiconductor package, a power semiconductor die mounted on the first power electronics carrier, and an encapsulant body of electrically insulating material that encapsulates the power semiconductor die and the structured metallization layers of the first and second power electronics carriers, wherein the first pair of the metal pads are laterally isolated from one another by a first minimum separation distance, and wherein the second pair of the metal pads are laterally isolated from one another by a second minimum separation distance that is greater than the first minimum separation distance.

A method of forming a semiconductor package is disclosed. According to an embodiment, the method comprises providing a first power electronics carrier comprising a structured metallization layer disposed on an electrically insulating substrate, mounting a power semiconductor die on the first power electronics carrier, forming an encapsulant body of electrically insulating material that encapsulates the power semiconductor die and the structured metallization layer of the first power electronics carrier, wherein the semiconductor package comprises a first pair of metal pads that are immediately laterally adjacent one another and are low-voltage difference nodes of the semiconductor package and a second pair of metal pads that are immediately laterally adjacent one another and are high-voltage difference nodes of the semiconductor package, wherein the first pair of the metal pads are laterally isolated from one another by a first minimum separation distance, and wherein the second pair of the metal pads are laterally isolated from one another by a second minimum separation distance that is greater than the first minimum separation distance.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B, illustrates an assembly for forming a semiconductor package, according to an embodiment. FIG. 2A illustrates a first power electronics carrier of the assembly and FIG. 2B illustrates a second power electronics carrier of the assembly.

DETAILED DESCRIPTION

The embodiments described herein provide a semiconductor package that is advantageously configured to withstand significant delamination between the encapsulant body and the structured package metallization without failing electrical testing. This is achieved through appropriate spacing between the structured metal pads of the semiconductor package. In more detail, the semiconductor package may comprise at least one power electronics carrier, such as a DBC (direct bonded copper) substrate, an AMB (active metal brazed) substrate, or an IMS (insulated metal substrate) substrate, that accommodates the mounting of devices thereon and/or is used for electrical redistribution. The semiconductor package is configured such that a trench spacing between high-voltage difference nodes of the semiconductor package, e.g., pads which experience voltage differences of at least 100V, 400V, 600V, 1200V or more during operation, is intentionally made larger than the minimum allowable trench spacing of the structured metallization layer. In particular, the trench spacing in these regions can be made to satisfy creepage and clearance requirements for the voltage class and material group of the semiconductor package. As a result, the high-voltage difference nodes are sufficiently far apart to maintain adequate electrical isolation regardless of whether delamination between the encapsulant body and the package metallization occurs.

Meanwhile, the low-voltage difference nodes of the semiconductor package, e.g., pads which experience voltage differences of less than 100V, 60V, etc., during operation are spaced apart from one another by a lesser distance, which may be the minimum allowable trench spacing of the structured metallization layer. By bifurcating the pad spacing in this way, this arrangement can eliminate the need to perform specific mold adhesion promotor steps before the molding process, e.g., surface roughening steps and/or the application of special coatings, e.g., plating layers comprising Zn, Ni, Mo, Ag, Cr, Au, Pd, Pt, etc. As a result, an advantageous decrease in manufacturing cost can be realized.

Figure 1:
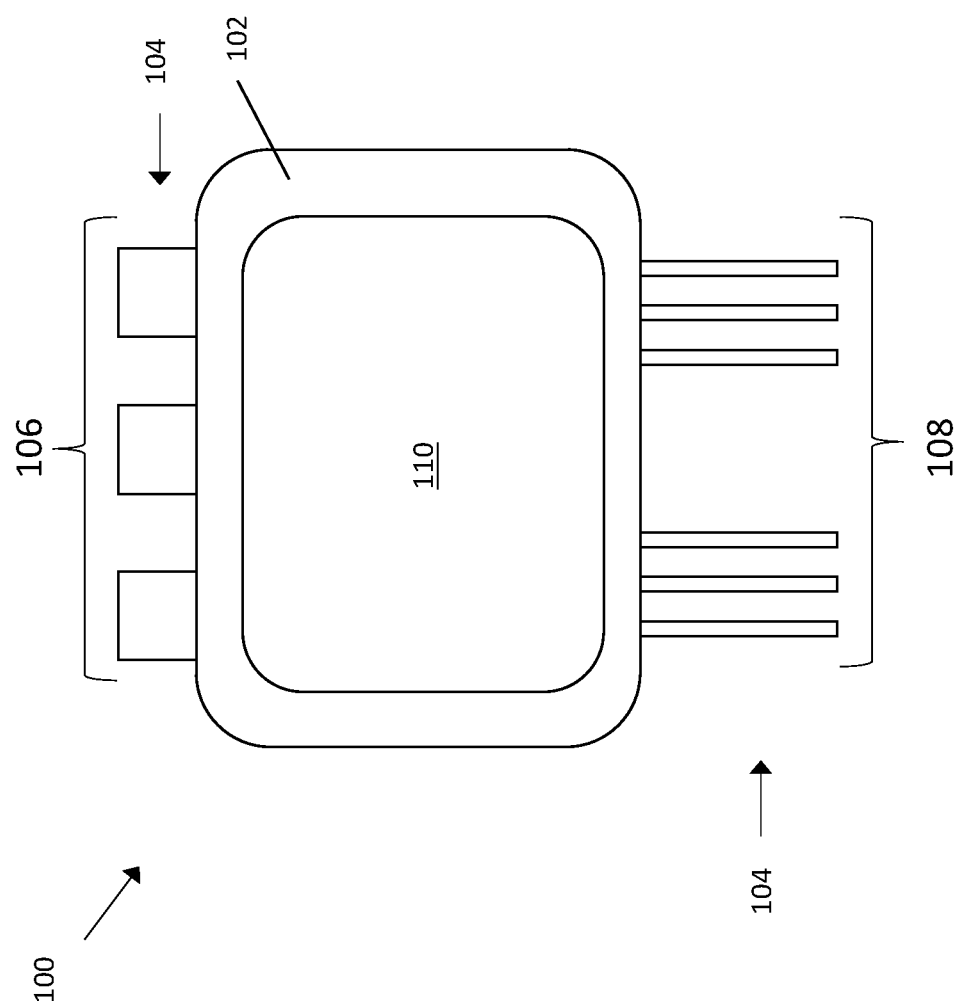
FIG. 1 illustrates a semiconductor package, according to an embodiment.

Referring to FIG. 1, a semiconductor package 100 is depicted, according to an embodiment. The semiconductor package 100 comprises an encapsulant body 102 that seals and protects the elements contained within it. The encapsulant body 102 comprises an electrically insulating material, such as epoxy, thermosetting plastic, polymer, resin, or pre-preg material (pre impregnated fibre) such as FR-2, FR-4, CEM-1, G-10, etc.

The semiconductor package 100 comprises a plurality of leads 104 that protrude out from outer edge sides of the encapsulant body 102. The leads 104 comprise a plurality of power leads 106 that protrude out from a first side of the encapsulant body 102 in the depicted embodiment. The power leads 106 form the power connections to/from the power devices encapsulated within the encapsulant body 102. For example, the power leads 106 may provide a fixed voltage, such as a positive potential ($+V_{DD}$), negative potential ($-V_{SS}$), reference potential (GND), or an output connection, such as a phase terminal (Ph). The leads 104 additionally comprise a plurality of signal leads 108 that protrude out from a second side of the encapsulant body 102 opposite from the first side encapsulant body 102 in the depicted embodiment. The signal leads 108 may provide all other connections aside from the power connections. For example, the signal leads 108 may comprise control terminals that are connected to the gate terminals of transistor dies and sensing or measurement terminals, e.g., source/emitter current sense, collector/drain current sense, temperature sense, etc. The concepts described herein are more generally applicable to semiconductor packages having a variety of lead configurations, including packages wherein at least one power lead is disposed on the same side of the semiconductor package as a signal lead.

The semiconductor package 100 additionally comprises an exposed metal surface 110 that is exposed from a main side of encapsulant body 102. The exposed metal surface 110 may be thermally coupled to the heat generating elements encapsulated within the encapsulant body 102 and may be mated with a heat dissipating structure such as a metal heat sink, thus allowing for efficient extraction of heat during operation. Optionally, the semiconductor package 100 may comprise a second exposed metal surface 110 (not shown) at an opposite side of encapsulant body 102, thus providing a so-called dual side cooling configuration wherein heat can be extracted from the semiconductor package 100 in both directions.

According to an embodiment, the semiconductor package 100 is configured as a power module. A power module refers to a type of packaged semiconductor device that comprises multiple power devices incorporated therein. These power devices and the circuits formed by these power devices are rated to accommodate power loads commensurate with power electronics applications, which may involve voltages of at least 400V, 600V, 1200V, 2400V or more and/or may involve currents of at least 1 A, 2 A, 10 A, 50 A or more. A power module may comprise a power conversion circuit such as a DC/AC inverter, a DC/DC converter, an AC/DC converter, a DC/AC converter, an AC/AC converter, or the like. In these circuits, a power transistor, such as a MOSFET, IGBT, HEMT, etc., may be used to switch the full load voltage in accordance with a power control scheme, e.g., pulse width modulation. A power module may be a so-called integrated power module that comprises driver devices, e.g., logic dies, that are configured to control the switching operation of the power transistors.

Figure 2:
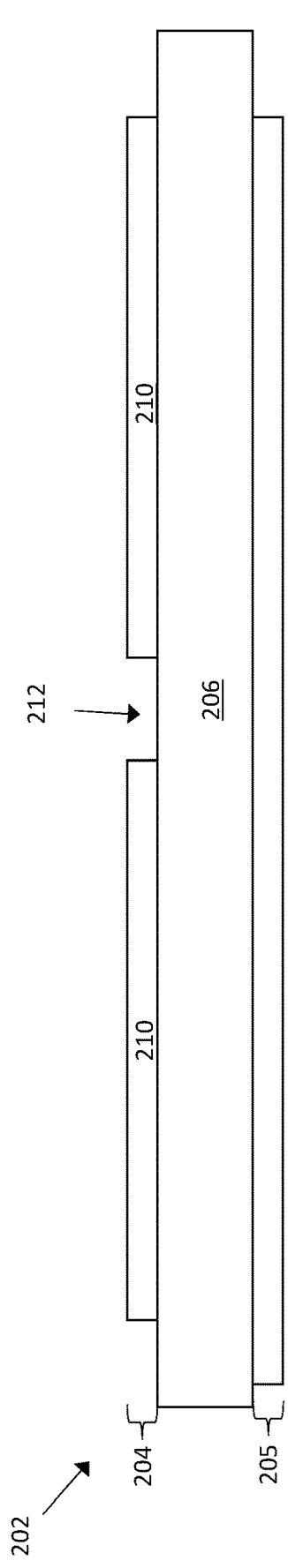
FIG. 2, which includes
Figure 2:
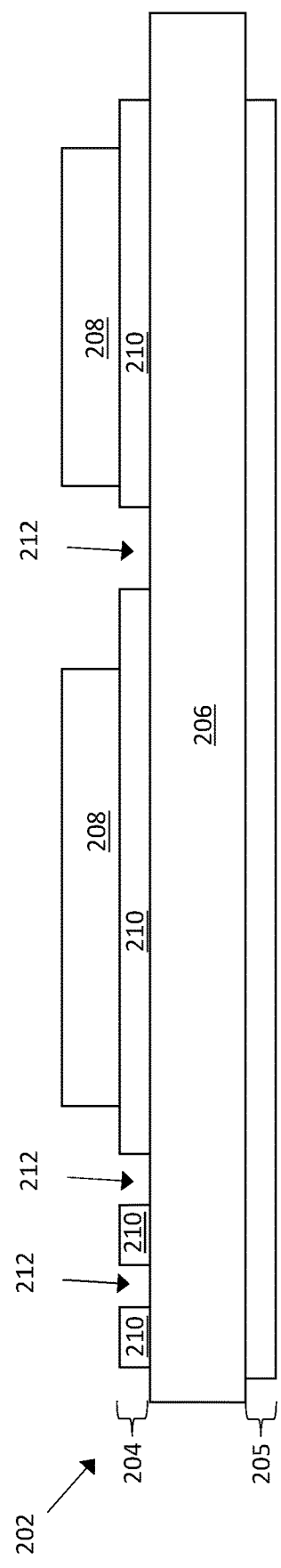

More generally, the concepts described herein are applicable to any type of semiconductor package that comprises an electronics carrier with structured metal pads disposed on an electrically insulating substrate, such as a DBC, AMB, IMS, PCB etc., wherein the electronics carrier is monolithically integrated into the package structure and/or encapsulated by an encapsulant material Referring to FIG. 2 an assembly 200 for producing the semiconductor package 100 is depicted, according to an embodiment. The assembly 200 comprises a pair of power electronics carriers 202, namely a first power electronics carrier 202 that is shown in FIG. 2A and a second power electronics carrier 202 that is shown in FIG. 2B. The first power electronics carrier 202 that is shown in FIG. 2A and the second power electronics carrier 202 that is shown in FIG. 2B may be, but are not necessarily, the same type of carrier.

The first power electronics carrier 202 that is shown in FIG. 2A and the second power electronics carrier 202 that is shown in FIG. 2B may have the following features. The power electronics carrier 202 may be a circuit carrier or substrate that is adapted to meet the cooling and current carrying requirements of power electronics applications. Examples of these power electronics substrates include DBC (direct bonded copper) substrates, AMB (active metal brazed) substrates, or an IMS (insulated metal substrate) substrates. The power electronics carrier 202 may also be a PCB (printed circuit board) that is adapted for high power operation. The power electronics carrier 202 comprises a structured metallization layer 204 disposed on a main or upper side of the power electronics carrier 202. The structured metallization layer 204 may comprise or be plated with any or more of Cu, Ni, Ag, Au, Pd, Pt, NiV, NiP, NiNiP, NIP/Pd, Ni/Au, NiP/Pd/Au, or NiP/Pd/AuAg. The power electronics carrier 202 further comprises an electrically insulating substrate 206 that the structured metallization layer 204 is formed on or attached to. The electrically insulating substrate 206 comprises a dielectric material, which may be a ceramic such as $Al_2O_3$ (Alumina) AlN (Aluminium Nitride), etc., in the case of a DBC, AMB or IMS, or a pre-preg material (pre impregnated fibre) such as FR-2, FR-4, CEM-1, G-10, etc. in the case of a PCB. In addition to the structured metallization layer 204, the power electronics carrier 202 may comprise a second metallization layer 205 on a rear side of the power electronics carrier 202. This second metallization layer 205 may be a continuous layer comprising any of the above-listed materials for the structured metallization layer 204. This second metallization layer 205 may form the exposed metal surface 110 that is used to thermally couple the semiconductor package 100 to a cooling apparatus.

A plurality of semiconductor dies 208 is mounted on the first power electronics carrier 202 shown in FIG. 2A. Generally speaking, the semiconductor dies 208 can be formed in a wide variety of device technologies that utilize a wide variety of semiconductor materials. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

According to an embodiment, at least one of the semiconductor dies 208 is a power semiconductor die. A power semiconductor die refers to a single die that is rated to accommodate voltages of at least 100 V (volts), and more typically voltages of 600 V, 1200 V or more and/or is rated to accommodate currents of at least 1 A, and more typically currents of 10 A, 50 A, 100 A or more. Examples of power semiconductor dies include discrete power diodes and discrete power transistor dies, e.g., MOSFETs (Metal Oxide Semiconductor Field Effect Transistors), IGBTs (Insulated Gate Bipolar Transistors), and HEMTs (High Electron Mobility Transistors), etc. The semiconductor dies 208 that are configured as power semiconductor dies may be configured as a vertical device, which refers to a device that conducts a load current between opposite facing main and rear surfaces of the die. Alternatively, the power semiconductor dies 208 that are configured as power semiconductor dies may be configured as a lateral device, which refers to a device that conducts a load current parallel to a main surface of the die. Separately or in combination, the semiconductor dies 208 mounted on the first power electronics carrier 202 shown in FIG. 2A may comprise other types of devices, e.g., logic devices, custom circuits, controllers, sensing devices, passive elements, etc.

The structured metallization layer 204 from the first power electronics carrier 202 shown in FIG. 2A comprises a plurality of isolated pads 210. The pads 210 are laterally electrically isolated by one another by trenches 212 that extend through the structured metallization layer 204 and reach the electrically insulating substrate 206 of the power electronics carrier 202. The trenches 212 can be formed by metal patterning techniques. For example, the structured metallization layer 204 geometry can be realized by initially providing a substantially uniform thickness of sheet of metal, e.g., copper, aluminum, etc., and subsequently patterning the sheet of metal using techniques such as etching, metal plating, laser cutting, etc. The pads 210 of the structured metallization layer 204 are formed into die pad structures that are dimensioned to accommodate the mounting of the semiconductor dies 208 thereon. In addition, the pads 210 of the structured metallization layer 204 are formed into conductive tracks that are used to provide electrical interconnect between the various elements mounted on the first power electronics carrier 202 shown in FIG. 2A and the leads 104 and/or between the various elements mounted on the first power electronics carrier 202 shown in FIG. 2A.

The semiconductor dies 208 may be mounted on the pads 210 of the structured metallization layer 204 using an adhesive, e.g., solder, sinter, conductive glue, etc. In the case of a vertical device, the adhesive may form an electrically conductive connection between the semiconductor dies 208 and the pads 210, e.g., a connection to a rear side terminal such as a source, drain, collector, emitter, etc. Electrical interconnection between the various elements on the first power electronics carrier 202 shown in FIG. 2A may be effectuated using metal interconnect elements, e.g., clips, ribbons, bond wires (as shown), etc., that are soldered to the devices and/or metal pads 210.

The structured metallization layer 204 of the second power electronics carrier 202 that is shown in FIG. 2B likewise comprises a plurality of isolated pads 210 that are laterally electrically isolated by one another by trenches 212 in a similar manner as described above. In the depicted embodiment, the structured metallization layer 204 of second power electronics carrier 202 does nor comprise any devices mounted thereon, and instead can be used as an electrical interconnect and cooling structure in a manner to be described in further detail below.

After mounting the semiconductor dies 208 and mounting any other elements such as passives, solder bridges, etc., and forming the necessary electrical connections on the first power electronics carrier 202 shown in FIG. 2A, the semiconductor package 100 can be produced by flipping the second power electronics carrier 202 upside down relative to the perspective of FIG. 2B such that the semiconductor dies 208 are arranged between the first and second power electronics carriers 202 and such that the structured metallization layers 204 of the first and second power electronics carriers 202 face one another. Subsequently, the encapsulant body 102 may be formed to encapsulate each of the semiconductor dies 208 mounted on the first power electronics carrier 202 shown in FIG. 2A and each of the metal pads 210 from the structured metallization layers 204 of the first and second first power electronics carriers 202. The encapsulant body 102 can be formed according to a variety of device encapsulation techniques. According to an embodiment, the encapsulant body 102 is formed by a molding process such as injection molding, transfer molding, compression molding, etc. According to this technique, the assembly 200 is arranged into the cavity of a molding tool, and liquified mold compound is injected into the molding tool and is subsequently cured to form the encapsulant body 102.

According to an embodiment, the above-described technique is used to produce a semiconductor package that is configured as a so-called double-sided cooling power module. According to this concept, the second power electronics carrier 202 that is shown in FIG. 2B serves as an electrical redistribution structure that provides fixed voltages, e.g., positive potential ($+V_{DD}$), a negative potential ($-V_{SS}$), reference potential (GND), etc., and/or signal connections to the semiconductor dies 208 and serves as a cooling structure that extracts heat from the semiconductor dies 208. An electrically conductive spacer (not shown) may be provided between the semiconductor dies 208 and the second power electronics carrier 202 to effectuate the necessary electrical connections while maintaining vertical separation. An example of a double-sided cooling power module arranged in this way is disclosed in U.S. Pat. No. 11,004,764 to Hoegerl et al., and U.S. Pat. No. 11,018,072 to Hoegerl et al., the content of each document being incorporated by reference herein in their entirety.

In other embodiments, the second power electronics carrier 202 that is shown in FIG. 2B may comprise devices mounted thereon, e.g., additional power devices, passive devices, etc. In still other embodiments, the second power electronics carrier 202 that is shown in FIG. 2B may be omitted. For example, a semiconductor package 100 may be created using the power electronics carrier similar or identical to the first power electronics carrier 202 shown in FIG. 2A, and each of the necessary electrical connections may be effectuated conductive interconnect elements such as bond wires, clips, ribbons, etc.

Figure 3:
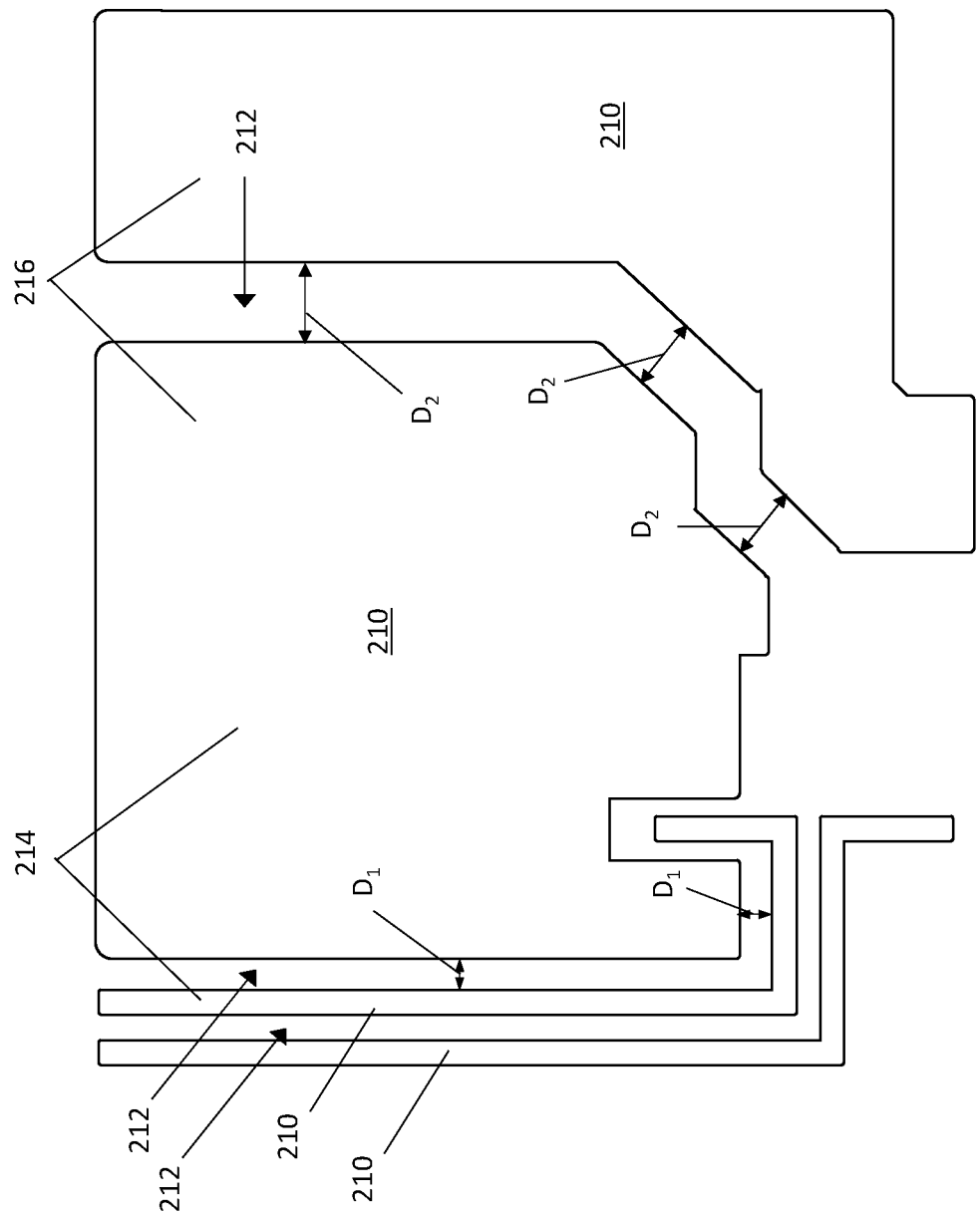
FIG. 3 schematically illustrates a pad configuration of a first power electronics carrier, according to an embodiment.

Referring to FIG. 3, a close-up view of the pad configuration of the first power electronics carrier 202 shown in FIG. 2A is schematically depicted, according to an embodiment. In this view, like reference numerals designate the same features, and certain elements including the electrically insulating substrate 206 and the semiconductor dies 208 are omitted for ease of illustration. The first power electronics carrier 202 shown in FIG. 2A comprises a first pair 214 of the metal pads 210 and a second pair 216 of the metal pads 210. The first pair 214 of the metal pads 210 and the second pair 216 of the metal pads 210 each consist of two of the metal pads 210 that are immediately laterally adjacent one another. That is, there is no intervening metal region of the structured metallization layer 204 between the metal pads 210 from the first pair 214 or between the metal pads 216 from the second pair 216.

The first pair 214 of the metal pads 210 are laterally isolated from one another by a first minimum separation distance $D_1$. The second pair 216 of the metal pads 210 are laterally isolated from one another by a second minimum separation distance $D_2$ that is greater than the first minimum separation distance $D_1$. In this context, the term minimum separation distance refers to the closest separation distance between the two laterally isolated pads 210 at any location of these pads 210. Thus, in the case that the pads 210 in question include localized notches or indentations that provide a local region of greater separation, the minimum separation distance is not realized in these notches or indentations. The description that the second minimum separation distance $D_2$ that is greater than the first separation distance refers to an intentional difference that is carried out in the formation of the metal pads 210 and does not result from unwanted process variation.

According to an embodiment, the first minimum separation distance $D_1$ is a minimum trench width of the structured metallization layer 204. The term minimum trench width as used herein refers to the minimum achievable width of the trench 212 that laterally isolates the pads 210 in question, and hence refers to the minimum achievable distance between laterally isolated pads 210. The minimum trench width is a design rule dictated by the producer of the power electronics carrier 202. As those having ordinary skill will appreciate, design rules are commonly used in electronics manufacturing to account for processing variation that is inherent and unavoidable to a particular manufacturing technique. Design rules ensure that certain geometries can be reliably formed within an acceptable window of statistical variation, e.g., within a three-sigma variation window. The minimum trench width is therefore dependent on the type of power electronics carrier and/or technique used to form the structured metallization layer 204. In numerical terms, the minimum trench width for a DCB substrate may be between about 0.25 mm-1.0 mm, and may be 0.5 mm in one specific example, while the minimum trench width for an AMB substrate may be between about 0.5 mm-1.0 mm, and may be 0.6 mm-0.8 mm in one example. These values are particular to current technologies which may vary on factors such as material type, etching process, metal thickness, etc. In any case, a minimum trench width must be associated with any electronics component as it represents the limits that a particular technology can produce.

In general, the second minimum separation distance $D_2$ can be any distance that is greater than the first minimum separation distance $D_1$. According to an embodiment, the second minimum separation distance $D_2$ is between two times and twenty times greater than the first minimum separation distance $D_1$ and may be between two times and ten times greater than the first minimum separation distance $D_1$, and more specifically between four and five times greater than the first minimum separation distance $D_1$. Stated in numerical terms, the first minimum separation distance $D_1$ may be between 0.5 mm and 1.0 mm, while the second minimum separation distance $D_2$ may between 1.0 mm and 20 mm, e.g., between 2.0 mm and 10 mm, or more specifically between 4.0 mm and 5.0 mm in an embodiment.

According to an embodiment, the first pair 214 of the metal pads 210 are low-voltage difference nodes of the semiconductor package 100. The low-voltage difference nodes of the semiconductor package 100 are nodes that are biased below a load voltage of the power devices of the semiconductor package 100 during all operational states of the semiconductor package 100. That is, the low-voltage difference nodes refer to those nodes that do not accommodate the maximum rated voltage of the power devices of the semiconductor package 100. The low-voltage difference nodes may include metal pads 210 that accommodate no greater than a maximum gate voltage of a power transistor, i.e., the voltage at which breakdown of the gate insulator occurs. Examples of these nodes include pads 210 that are biased at the gate-emitter potential relative to one another in the case of an IGBT or pads 210 that are biased at the gate-source potential relative to one another in the case of an IGBT. The low-voltage difference nodes may comprise gate nodes, measurement nodes, or sensing nodes, for example. The low-voltage difference nodes may also comprise a fixed voltage node, such as a reference potential node (e.g., GND) in the case that the second one of the low-voltage difference nodes creates the above-described voltage difference. Stated in numerical terms, the low-voltage difference nodes may comprise nodes that are biased at no greater than 100 V relative to one another during all operational states of the device and may comprise nodes of the semiconductor package 100 are nodes that are biased at no greater than 60 V relative to one another during all operational states of the device. These values encompass maximum input voltages of power transistor devices, e.g., gate-emitter in the case of an IGBT, gate-source in the case of a MOSFET etc., which are typically on the order of 40V, 20V or less.

According to an embodiment, the second pair 216 of the metal pads 210 are high-voltage difference nodes of the semiconductor package 100. The high-voltage difference nodes of the semiconductor package 100 are nodes that are biased at the load voltage of the one or more discrete power devices during an operational state of the power module. Thus, the second pair 216 of the metal pads 210 may correspond to a pair of nodes that are connected to the power leads 106 and/or and may comprise a positive potential node (+$V_{DD}$), a negative potential node (-$V_{SS}$), a reference potential node (GND), or an output node (Ph). Stated in numerical terms, the high-voltage difference nodes may experience a voltage difference of at least 100V, e.g., greater than 200V, 400V, 600V, 1,200V or more, during operation.

As can be appreciated from the above-discussion, the terms low-voltage difference nodes and high-voltage nodes refer to a relative arrangement between two metal pads 210 based on the range of voltages that these pads 210 experience during the operation of the semiconductor package 100. Thus, the term low-voltage difference nodes or high-voltage difference node, as the case may be, refers to pairs of the metal pads 210 wherein each individual pad 210 from the pair does not necessarily meet the description when compared with different pads 210 outside of the pair. An example of this is shown in the depicted embodiment, wherein the first pair 214 of the metal pads 210 comprises a first one of the pads 210 that is centrally located and a second one of the metal pads 210 that is adjacent to one side of the first one of the pads 210, whereas the second pair 216 of the metal pads 210 comprises the first one of the pads 210 that is centrally located and a third one of the metal pads 210 that is adjacent to an opposite side of the first one of the pads 210. In this example, the first one of the pads 210 may be a reference potential pad, e.g., a GND, the second one of the pads 210 may be configured as a gate signal pad, for example, and the third one of the metal pads 210 may be an output node (e.g., Ph) that reaches voltages of least 200 V, 400 V, 600V, 1,200 V or more relative to GND during operation.

Figure 4:
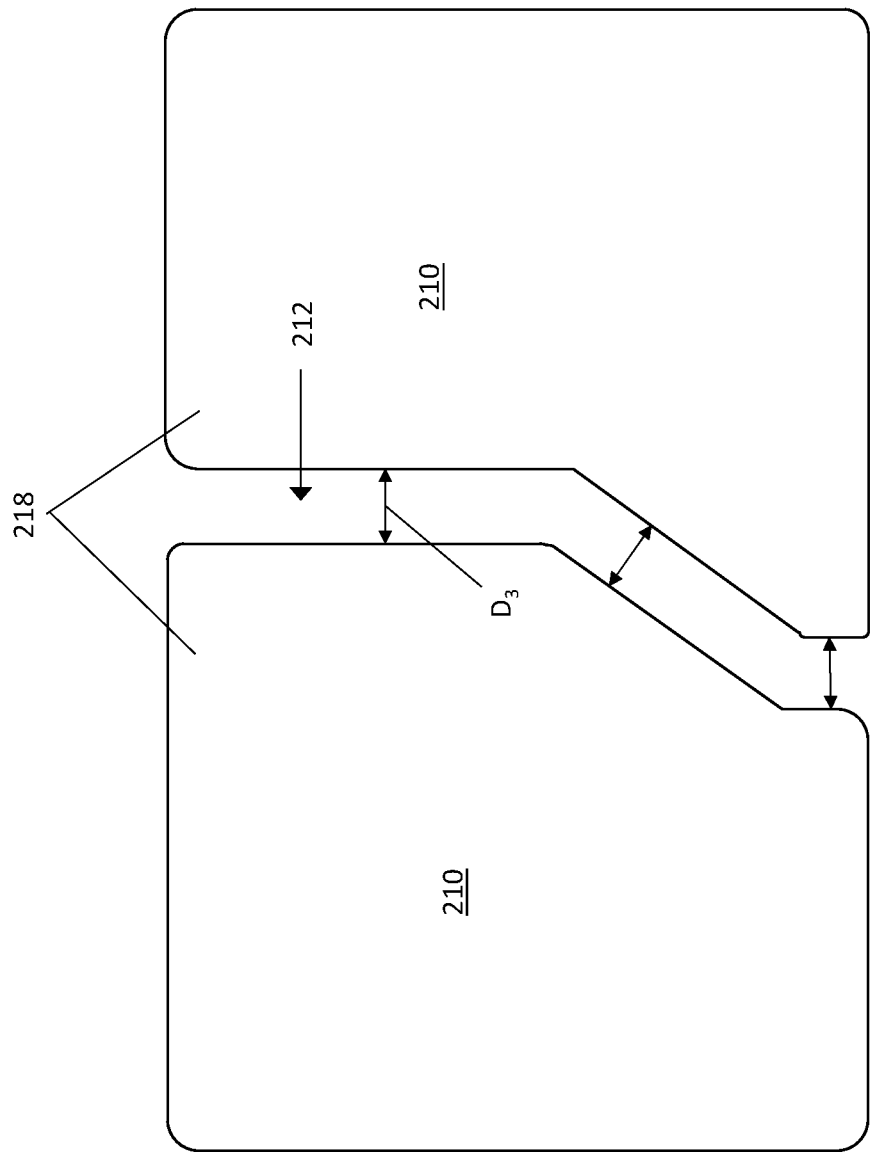
FIG. 4 schematically illustrates a pad configuration of a second power electronics carrier, according to an embodiment.

Referring to FIG. 4, a close-up view of the pad configuration of the second power electronics carrier 202 shown in FIG. 2B is schematically depicted, according to an embodiment. In this view, like reference numerals designate the same features, and certain elements including the electrically insulating substrate 206 are omitted for ease of illustration. As shown, the second power electronics carrier 202 shown in FIG. 2B comprises a third pair 218 of the metal pads 210 that laterally isolated from one another. The third pair 218 of the metal pads 210 may be high-voltage difference nodes of the semiconductor package 100. For example, the third pair 218 of the metal pads 210 may correspond to the metal pads that provide a positive potential node ($+V_{DD}$) and the reference potential node (GND) to the upper surface terminals 208 of the semiconductor dies According to an embodiment, the third pair 218 of the metal pads 210 are laterally isolated from one another by a third minimum separation distance $D_3$. The third minimum separation distance $D_3$ may correspond to the second minimum separation distance $D_2$ described above with reference to FIG. 2A. Accordingly, the semiconductor package 100 may comprise the first pair 214 of the metal pads 210 from the first power electronics carrier 202 shown in FIG. 2A being spaced apart from one another by the first minimum separation distance $D_1$ in the manner described above, with the third pair 218 of the metal pads 210 being spaced apart from one another by a third minimum separation distance $D_3$ that is greater than this first minimum separation distance $D_1$. Separately or in combination, the third minimum separation distance $D_3$ may be greater than the minimum trench width of the structured metallization layer 206 from the second power electronics carrier 202 shown in FIG. 2B. In that case, the structured metallization layer 206 from the second power electronics carrier 202 may comprise other trenches 212 (not shown) that are formed to be at the minimum trench width.

By arranging the high-voltage difference nodes of the semiconductor package 100 to be separated from one another by a greater distance than the low-voltage difference nodes of the semiconductor package 100 and/or by a greater distance than the minimum trench width of the power electronics carrier 202 to which they are formed in, an arrangement that is advantageously resistant to failure is realized. In more detail, the material of the encapsulant body 102 may separate from the power electronics carrier 202 at some point during or after encapsulation. For example, if the encapsulant body 102 is formed by a molding process, delamination may occur between the mold compound and the structured metallization layer 204. Delamination refers to an unwanted but sometimes unavoidable by-product of the encapsulation process wherein small voids or gaps arise between the encapsulant material and the power electronics carrier. These small voids or gaps are particularly likely to occur at or within the vicinity of the trenches 212, due to the acute corners and geometric transitions. These voids or gaps decrease the maximum voltage that can be maintained between the two pads 210 by creating a possible voltage breakdown path. Moreover, these voids or gaps may cause an otherwise acceptable part to fail electrical stress testing. By increasing the separation distance between these high-voltage difference nodes, increased electrical isolation is realized and the likelihood of failing an electrical stress test may be decreased.

The value of the separation distance between the high-voltage difference nodes of the semiconductor package 100, whether in absolute numerical terms or in relative terms to the first separation distance, may be selected based on design considerations pertaining to electrical isolation, e.g., maximum voltage difference between the pads 210, material composition of the structured metallization layer 204, material composition of the encapsulant, presence of an adhesion promotor on the structured metallization layer 204 and so forth.

According to an embodiment, the high-voltage difference nodes of the semiconductor package 100 are separated from one another by a distance that meets a minimum creepage distance and clearance distance requirement for the semiconductor package 100. Creepage distance refers to the shortest distance along electrically insulating material between two conductive surfaces. Clearance distance refers to the shortest path between two conductive surfaces in a direct line. Industry standards for creepage distance and clearance distance published by organizations such as JEDEC (Joint Electron Device Engineering Council) UL (Underwriter Laboratories), or IEC (International Electrotechnical Commission). These industry standards define minim creepage and clearance requirements for given devices, applications and/or voltage classes of devices. One example of such a standard is IEC 6061, which defines minimum creepage and clearance requirements for medical equipment. By selecting the second minimum separation distance $D_2$ and/or the third minimum separation distance $D_3$ to meet a minimum creepage distance clearance distance requirement for the high-voltage difference nodes of the semiconductor package 100, the semiconductor package 100 is impervious to failure arising from complete voids between the pads 210 which form the high-voltage difference nodes. Meanwhile, by selecting the first minimum separation distance $D_1$ to be lower between the low-voltage difference nodes where the possibility of failure due to voltage breakdown is much lower or non-existent, advantageous space efficiency is realized.

By tailoring the separation distance between the various pads 210 of the semiconductor package 100 in the above-described manner, an adhesion promotor step on the first power electronics carrier 202 shown in FIG. 2A and/or the second power electronics carrier 202 shown in FIG. 2B can be omitted. An adhesion promotor step refers to a processing step that is specifically performed to enhance chemical or mechanical adhesion between the encapsulant material, e.g., mold compound, and the metal regions that are covered by the encapsulant material. An adhesion promotor step may comprise the application of a special coating, such as a metal plating comprising e.g., Zn, Ni, Mo, Ag, Cr, Au, Pd, Pt, etc., to the metallized surfaces of the semiconductor package 100. Separately or in combination, an adhesion promotor step may comprise an intentional roughening step that increases the surface area of the metallized surfaces, thereby enhancing the bond between the metallized surface and the encapsulant. In either case, adhesion promotor steps add cost and complexity to the manufacture of a semiconductor package. The semiconductor packages 100 described herein avoid having to perform some or all of these adhesion promotor steps.

In an embodiment, the encapsulation process is performed without performing an adhesion promotor step on both the power electronics carrier 202 shown in FIG. 2A and the second power electronics carrier 202 shown in FIG. 2B. That is, neither one of the power electronics carriers 202 is treated with an adhesion promotor. In that case, the high-voltage nodes from the power electronics carrier 202 shown in FIG. 2A and the second power electronics carrier 202 shown in FIG. 2B may each spaced apart from one another by a distance greater than the minimum trench separation distance of the respective electronics carrier 202 for each the high-voltage node, e.g., by an amount equal to the creepage and clearance requirement. This mitigates the possibility of voltage breakdown if delamination occurs between the encapsulant material and either one of the power electronics carriers 202.

In an embodiment, the encapsulation process is performed without performing an adhesion promotor step on the second power electronics carrier 202 shown in FIG. 2B, while an adhesion promotor step is performed on the power electronics carrier 202. In that case, the high-voltage nodes from the second power electronics carrier 202 shown in FIG. 2B may each spaced apart from one another by a distance greater than the minimum trench separation distance of the second power electronics carrier 202, e.g., by an amount equal to the creepage and clearance requirement. Meanwhile, the power electronics carrier 202 shown in FIG. 2A may not necessarily have the above-described discrepancy in separation distancer between high-voltage nodes and low-voltage nodes, e.g., each of the pads 210 may be separated by a distance equal to the minimum trench separation distance of the first power electronics carrier 202 shown in FIG. 2A, as the adhesion promotor applied to the first power electronics carrier 202 protects against delamination and hence voltage breakdown. Meanwhile, the pad configuration of the second power electronics carrier 202 shown in FIG. 2B protects against voltage breakdown for the reasons stated above, while lowering cost by eliminating the need for a dedicated adhesion promotor step.

Although the present disclosure is not so limited, the following numbered examples demonstrate one or more aspects of the disclosure.

Example 1. A semiconductor package, comprising: a first power electronics carrier comprising a structured metallization layer disposed on an electrically insulating substrate; a power semiconductor die mounted on the first power electronics carrier; and a first pair of metal pads that are immediately laterally adjacent one another and are low-voltage difference nodes of the semiconductor package; a second pair of metal pads that are immediately laterally adjacent one another and are high-voltage difference nodes of the semiconductor package; and an encapsulant body of electrically insulating material that encapsulates the power semiconductor die and the first and second pairs of metal pads, wherein the first pair of the metal pads are laterally isolated from one another by a first minimum separation distance, and wherein the second pair of the metal pads are laterally isolated from one another by a second minimum separation distance that is greater than the first minimum separation distance.

Example 2. The semiconductor package of claim 1, wherein the structured metallization layer of the first power electronics carrier comprises trenches that define a plurality of isolated pads, and wherein the plurality of isolated pads from the first power electronics carrier comprises the first pair of the metal pads.

Example 3. The semiconductor package of example 2, wherein the plurality of isolated pads from the first power electronics carrier comprises the second pair of the metal pads, and wherein the second minimum separation distance is greater than a minimum trench separation distance of the trenches in the structured metallization layer of the first power electronics carrier.

Example 4. The semiconductor package of example 3, wherein the first minimum separation distance is equal to the minimum trench separation distance of the trenches in the structured metallization layer of the first power electronics carrier.

Example 5. The semiconductor package of example 2, further comprising a second power electronics carrier comprising a structured metallization layer disposed on an electrically insulating substrate, wherein the first and second power electronics carriers are arranged with the power semiconductor die in between the first and second power electronics carriers and with the structured metallization layers of the first and second power electronics carriers facing one another.

Example 6. The semiconductor package of example 5, wherein the structured metallization layer of the second power electronics carrier comprises trenches that define a plurality of isolated pads, wherein the plurality of isolated pads from the second power electronics carrier comprises the second pair of the metal pads, and wherein the second minimum separation distance is greater than a minimum trench separation distance of the trenches in the structured metallization layer of the second power electronics carrier.

Example 7. The semiconductor package of example 1, wherein the second separation distance is between two times and twenty times greater than the first minimum separation distance.

Example 8. The semiconductor package of example 1, wherein the first minimum separation distance is between 0.5 mm and 1.0 mm, and wherein the second separation distance is between 1.0 mm and 20 mm.

Example 9. The semiconductor package of example 1, wherein the first power electronics carrier is any one of: a direct bonded copper substrate, an active metal brazed substrate, or an insulated metal substrate.

Example 10. The semiconductor package of example 1, wherein the semiconductor package is a power module comprising one or more discrete power devices, wherein the low-voltage difference nodes of the semiconductor package are nodes that are biased below a load voltage of the one or more discrete power devices during all operational states of the power module, and wherein the high-voltage difference nodes of the semiconductor package are nodes that are biased at the load voltage of the one or more discrete power devices during an operational state of the power module.

Example 11. The semiconductor package of example 10, wherein the low-voltage difference nodes of the semiconductor package comprise any one or more of: a gate node, a sensing node, and a reference potential node, and wherein the high-voltage difference nodes of the semiconductor package comprise any one or more of: a positive fixed potential node, a negative fixed potential node, a reference potential node, and an output node.

Example 12. The semiconductor package of example 1, wherein the low-voltage difference nodes of the semiconductor package are nodes that are biased at no greater than 100 V during all operational states of the power module.

Example 13. The semiconductor package of example 12, wherein the low-voltage difference nodes of the semiconductor package are nodes that are biased at no greater than 60 V during all operational states of the power module.

Example 14. A semiconductor package, comprising: a first power electronics carrier comprising a structured metallization layer disposed on an electrically insulating substrate; a second power electronics carrier comprising a structured metallization layer disposed on an electrically insulating substrate; a first pair of metal pads from the structured metallization layer of the first power electronics carrier that are immediately laterally adjacent one another and are low-voltage difference nodes of the semiconductor package; a second pair of metal pads from the structured metallization layer of the second power electronics carrier that are immediately laterally adjacent one another and are high-voltage difference nodes of the semiconductor package; a power semiconductor die mounted on the first power electronics carrier; and an encapsulant body of electrically insulating material that encapsulates the power semiconductor die and the structured metallization layers of the first and second power electronics carriers, wherein the first pair of the metal pads are laterally isolated from one another by a first minimum separation distance, and wherein the second pair of the metal pads are laterally isolated from one another by a second minimum separation distance that is greater than the first minimum separation distance.

Example 15. The semiconductor package of example 14, wherein the structured metallization layers of the first and second power electronics carriers each comprise trenches that define a plurality of isolated pads, wherein the first minimum separation distance is equal to a minimum trench separation distance of the structured metallization layer of the first power electronics carrier, and wherein the second minimum separation distance is equal to a minimum trench separation distance of the trenches in the structured metallization layer of the second power electronics carrier.

Example 16. A method of producing a semiconductor package, the method comprising: providing a first power electronics carrier comprising a structured metallization layer disposed on an electrically insulating substrate; mounting a power semiconductor die on the first power electronics carrier; forming an encapsulant body of electrically insulating material that encapsulates the power semiconductor die and the structured metallization layer of the first power electronics carrier, wherein the semiconductor package comprises a first pair of metal pads that are immediately laterally adjacent one another and are low-voltage difference nodes of the semiconductor package and a second pair of metal pads that are immediately laterally adjacent one another and are high-voltage difference nodes of the semiconductor package, wherein the first pair of the metal pads are laterally isolated from one another by a first minimum separation distance, and wherein the second pair of the metal pads are laterally isolated from one another by a second minimum separation distance that is greater than the first minimum separation distance.

Example 17. The method of example 16, wherein the structured metallization layer of the first power electronics carrier comprises trenches that define a plurality of isolated pads, and wherein the plurality of isolated pads from the first power electronics carrier comprises the first pair of the metal pads.

Example 18. The method of example 16, wherein forming the encapsulant body comprises a molding process.

Example 19. The method of example 18, wherein the plurality of isolated pads from the first power electronics carrier comprises the second pair of the metal pads, and wherein the structured metallization layer of the first power electronics carrier is encapsulated by the encapsulant body without performing an adhesion promotor step on the structured metallization layer of the first power electronics carrier.

Example 20. The method of example 18, further comprising: providing a second power electronics carrier comprising a structured metallization layer disposed on an electrically insulating substrate; and arranging the power semiconductor die in between the first and second power electronics carriers and with the structured metallization layers of the first and second power electronics carriers facing one another, wherein forming the encapsulant body encapsulates the structured metallization layer of the second power electronics carrier, and wherein the structured metallization layer of the second power electronics carrier is encapsulated by the encapsulant body without performing an adhesion promotor step on the structured metallization layer of the second power electronics carrier.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following examples and their legal equivalents.

The invention claimed is:

1. A semiconductor package, comprising:
   a first power electronics carrier comprising a structured metallization layer disposed on an electrically insulating substrate;
   a power semiconductor die mounted on the first power electronics carrier; and
   a first pair of metal pads that are immediately laterally adjacent one another and are low-voltage difference nodes of the semiconductor package;

a second pair of metal pads that are immediately laterally adjacent one another and are high-voltage difference nodes of the semiconductor package; and an encapsulant body of electrically insulating material that encapsulates the power semiconductor die and the first and second pairs of metal pads, wherein the first pair of the metal pads are laterally isolated from one another by a first minimum separation distance, and wherein the second pair of the metal pads are laterally isolated from one another by a second minimum separation distance that is greater than the first minimum separation distance.

2. The semiconductor package of claim 1, wherein the structured metallization layer of the first power electronics carrier comprises trenches that define a plurality of isolated pads, and wherein the plurality of isolated pads from the first power electronics carrier comprises the first pair of the metal pads.

3. The semiconductor package of claim 2, wherein the plurality of isolated pads from the first power electronics carrier comprises the second pair of the metal pads, and wherein the second minimum separation distance is greater than a minimum trench separation distance of the trenches in the structured metallization layer of the first power electronics carrier.

4. The semiconductor package of claim 3, wherein the first minimum separation distance is equal to the minimum trench separation distance of the trenches in the structured metallization layer of the first power electronics carrier.

5. The semiconductor package of claim 2, further comprising a second power electronics carrier comprising a structured metallization layer disposed on an electrically insulating substrate, wherein the first and second power electronics carriers are arranged with the power semiconductor die in between the first and second power electronics carriers and with the structured metallization layers of the first and second power electronics carriers facing one another.

6. The semiconductor package of claim 5, wherein the structured metallization layer of the second power electronics carrier comprises trenches that define a plurality of isolated pads, wherein the plurality of isolated pads from the second power electronics carrier comprises the second pair of the metal pads, and wherein the second minimum separation distance is greater than a minimum trench separation distance of the trenches in the structured metallization layer of the second power electronics carrier.

7. The semiconductor package of claim 1, wherein the second separation distance is between two times and twenty times greater than the first minimum separation distance.

8. The semiconductor package of claim 1, wherein the first minimum separation distance is between 0.5 mm and 1.0 mm, and wherein the second separation distance is between 1.0 mm and 20 mm.

9. The semiconductor package of claim 1, wherein the first power electronics carrier is any one of: a direct bonded copper substrate, an active metal brazed substrate, or an insulated metal substrate.

10. The semiconductor package of claim 1, wherein the semiconductor package is a power module comprising one or more discrete power devices, wherein the low-voltage difference nodes of the semiconductor package are nodes that are biased below a load voltage of the one or more discrete power devices during all operational states of the power module, and wherein the high-voltage difference nodes of the semiconductor package are nodes that are biased at the load voltage of the one or more discrete power devices during an operational state of the power module.

11. The semiconductor package of claim 10, wherein the low-voltage difference nodes of the semiconductor package comprise any one or more of: a gate node, a sensing node, and a reference potential node, and wherein the high-voltage difference nodes of the semiconductor package comprise any one or more of: a positive fixed potential node, a negative fixed potential node, a reference potential node, and an output node.

12. The semiconductor package of claim 1, wherein the low-voltage difference nodes of the semiconductor package are nodes that are biased at no greater than 100 V during all operational states of the power module.

13. The semiconductor package of claim 12, wherein the low-voltage difference nodes of the semiconductor package are nodes that are biased at no greater than 60 V during all operational states of the power module.

14. A semiconductor package, comprising:
a first power electronics carrier comprising a structured metallization layer disposed on an electrically insulating substrate;
a second power electronics carrier comprising a structured metallization layer disposed on an electrically insulating substrate;
a first pair of metal pads from the structured metallization layer of the first power electronics carrier that are immediately laterally adjacent one another and are low-voltage difference nodes of the semiconductor package;
a second pair of metal pads from the structured metallization layer of the second power electronics carrier that are immediately laterally adjacent one another and are high-voltage difference nodes of the semiconductor package;
a power semiconductor die mounted on the first power electronics carrier; and
an encapsulant body of electrically insulating material that encapsulates the power semiconductor die and the structured metallization layers of the first and second power electronics carriers,
wherein the first pair of the metal pads are laterally isolated from one another by a first minimum separation distance, and
wherein the second pair of the metal pads are laterally isolated from one another by a second minimum separation distance that is greater than the first minimum separation distance.

15. The semiconductor package of claim 14, wherein the structured metallization layers of the first and second power electronics carriers each comprise trenches that define a plurality of isolated pads, wherein the first minimum separation distance is equal to a minimum trench separation distance of the structured metallization layer of the first power electronics carrier, and wherein the second minimum separation distance is equal to a minimum trench separation distance of the trenches in the structured metallization layer of the second power electronics carrier.

16. A method of producing a semiconductor package, the method comprising:
providing a first power electronics carrier comprising a structured metallization layer disposed on an electrically insulating substrate;
mounting a power semiconductor die on the first power electronics carrier;

forming an encapsulant body of electrically insulating material that encapsulates the power semiconductor die and the structured metallization layer of the first power electronics carrier, wherein the semiconductor package comprises a first pair of metal pads that are immediately laterally adjacent one another and are low-voltage difference nodes of the semiconductor package and a second pair of metal pads that are immediately laterally adjacent one another and are high-voltage difference nodes of the semiconductor package, wherein the first pair of the metal pads are laterally isolated from one another by a first minimum separation distance, and wherein the second pair of the metal pads are laterally isolated from one another by a second minimum separation distance that is greater than the first minimum separation distance.

17. The method of claim 16, wherein the structured metallization layer of the first power electronics carrier comprises trenches that define a plurality of isolated pads, and wherein the plurality of isolated pads from the first power electronics carrier comprises the first pair of the metal pads.

18. The method of claim 16, wherein forming the encapsulant body comprises a molding process.

19. The method of claim 18, wherein the plurality of isolated pads from the first power electronics carrier comprises the second pair of the metal pads, and wherein the structured metallization layer of the first power electronics carrier is encapsulated by the encapsulant body without performing an adhesion promotor step on the structured metallization layer of the first power electronics carrier.

20. The method of claim 18, further comprising:
providing a second power electronics carrier comprising a structured metallization layer disposed on an electrically insulating substrate; and
arranging the power semiconductor die in between the first and second power electronics carriers and with the structured metallization layers of the first and second power electronics carriers facing one another,
wherein forming the encapsulant body encapsulates the structured metallization layer of the second power electronics carrier, and
wherein the structured metallization layer of the second power electronics carrier is encapsulated by the encapsulant body without performing an adhesion promotor step on the structured metallization layer of the second power electronics carrier.

* * * * *